(12) United States Patent
Steigerwald et al.

(10) Patent No.: US 10,573,747 B2
(45) Date of Patent: Feb. 25, 2020

(54) MULTI-THRESHOLD VOLTAGE DEVICES AND ASSOCIATED TECHNIQUES AND CONFIGURATIONS

(71) Applicant: INTEL CORPORATION, Santa Clara, CA (US)

(72) Inventors: Joseph M. Steigerwald, Forest Grove, OR (US); Tahir Ghani, Portland, OR (US); Jenny Hu, Hillsboro, OR (US); Ian R. C. Post, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/377,994

(22) Filed: Dec. 13, 2016

(65) Prior Publication Data

US 2017/0092542 A1   Mar. 30, 2017

Related U.S. Application Data

(63) Continuation of application No. 14/941,291, filed on Nov. 13, 2015, now Pat. No. 9,761,713, which is a
(Continued)

(51) Int. Cl.
*H01L 29/78* (2006.01)
*H01L 29/66* (2006.01)
(Continued)

(52) U.S. Cl.
CPC .... *H01L 29/7831* (2013.01); *H01L 21/28114* (2013.01); *H01L 21/82345* (2013.01);
(Continued)

(58) Field of Classification Search
CPC ........... H01L 29/7831; H01L 29/78645; H01L 29/4958; H01L 29/66484; H01L 29/7855;
(Continued)

(56) References Cited

U.S. PATENT DOCUMENTS

| 7,230,450 B2 | 6/2007 | Kurts et al. |
| 7,745,270 B2 | 6/2010 | Shah et al. |

(Continued)

FOREIGN PATENT DOCUMENTS

| CN | 101207155 | 6/2008 |
| CN | 103165459 | 6/2013 |

(Continued)

OTHER PUBLICATIONS

Notification of Transmittal of the International Search Report and Written Opinion of the International Searching Authority, dated Mar. 12, 2015, 16 pages.
(Continued)

*Primary Examiner* — Thanhha S Pham
(74) *Attorney, Agent, or Firm* — Schwabe, Williamson & Wyatt, P.C.

(57) ABSTRACT

Embodiments of the present disclosure describe multi-threshold voltage devices and associated techniques and configurations. In one embodiment, an apparatus includes a semiconductor substrate, a channel body disposed on the semiconductor substrate, a first gate electrode having a first thickness coupled with the channel body and a second gate electrode having a second thickness coupled with the channel body, wherein the first thickness is greater than the second thickness. Other embodiments may be described and/or claimed.

15 Claims, 8 Drawing Sheets

Related U.S. Application Data continuation of application No. 14/108,265, filed on Dec. 16, 2013, now Pat. No. 9,219,155.

(51) Int. Cl.

| | | |
|---|---|---|
| *H01L 27/088* | (2006.01) | |
| *H01L 29/423* | (2006.01) | |
| *H01L 21/28* | (2006.01) | |
| *H01L 29/49* | (2006.01) | |
| *H01L 29/786* | (2006.01) | |
| *H01L 29/51* | (2006.01) | |
| *H01L 21/8234* | (2006.01) | |

(52) U.S. Cl.
CPC ............ *H01L 21/823431* (2013.01); *H01L 21/823456* (2013.01); *H01L 27/0886* (2013.01); *H01L 29/42372* (2013.01); *H01L 29/4908* (2013.01); *H01L 29/4958* (2013.01); *H01L 29/4966* (2013.01); *H01L 29/517* (2013.01); *H01L 29/66484* (2013.01); *H01L 29/66772* (2013.01); *H01L 29/66795* (2013.01); *H01L 29/7855* (2013.01); *H01L 29/7856* (2013.01); *H01L 29/78645* (2013.01); *H01L 29/42376* (2013.01)

(58) Field of Classification Search
CPC .......... H01L 21/823437; H01L 29/786; H01L 29/66795; H01L 29/785; H01L 27/0886; H01L 21/823431
See application file for complete search history.

(56) References Cited

U.S. PATENT DOCUMENTS

| | | | |
|---|---|---|---|
| 8,354,309 | B2 | 1/2013 | Greene et al. |
| 8,653,605 | B2 | 2/2014 | Carter et al. |
| 8,659,084 | B1 | 2/2014 | Chang et al. |
| 8,741,757 | B2 | 6/2014 | Jagannathan et al. |
| 9,219,155 | B2 | 12/2015 | Steigerwald et al. |
| 2007/0052037 | A1 | 3/2007 | Luan |
| 2009/0206406 | A1 | 8/2009 | Rachmady et al. |
| 2010/0308418 | A1 | 12/2010 | Stahrengerg et al. |
| 2011/0059601 | A1 | 3/2011 | Yeh et al. |
| 2011/0111565 | A1 | 5/2011 | Nawaz |
| 2012/0230958 | A1 | 9/2012 | Kim et al. |
| 2012/0280330 | A1 | 11/2012 | Lee et al. |
| 2012/0292715 | A1 | 11/2012 | Hong et al. |
| 2013/0062704 | A1 | 3/2013 | Cheng et al. |
| 2013/0137234 | A1 | 5/2013 | Baars et al. |
| 2013/0224939 | A1 | 8/2013 | Jagannathan et al. |
| 2013/0221441 | A1 | 9/2013 | Jagannathan et al. |
| 2013/0230958 | A1 | 9/2013 | Lee |
| 2013/0249010 | A1 | 9/2013 | Ng et al. |
| 2013/0277683 | A1 | 10/2013 | Then et al. |
| 2014/0319623 | A1* | 10/2014 | Tsai .................... H01L 29/7855 257/401 |

FOREIGN PATENT DOCUMENTS

| | | |
|---|---|---|
| CN | 103325683 | 9/2013 |
| TW | 201334158 A1 | 8/2013 |

OTHER PUBLICATIONS

Taiwan IPO Search Report and Office Action dated Dec. 14, 2015, issued in corresponding Taiwan Patent Application No. 103139211, 16 pages.
Non-Final Office Action dated Sep. 28, 2016, issued in corresponding U.S. Appl. No. 14/941,291, filed Nov. 13, 2015.
Supplementary European Search Report dated Jun. 14, 2017, issued in related European patent application No. 14872869.4, 9 pages.
Taiwan IPO Search Report and Office Action dated Sep. 27, 2017, issued in corresponding Taiwan Patent Application No. 105119970, 32 pages.
International Preliminary Report on Patentablity for International Patent Application No. PCT/US2014/068210, dated Jun. 30, 2016, 13 pages.
Notice of Allowance from Taiwan Patent Application No. 103139211, dated May 24, 2016, 2 pages.
Office Action from Chinese Patent Application No. 201480062528. X, dated Jul. 27, 2018, 14 pages.
Search Report from European Patent Application No. 18194539.5, dated Dec. 10, 2018, 9 pgs.
Mayur Bhole et al: "FinFET—Benefits, Drawbacks and Challenges", International Journal of Engineering Sciences & Research Technology, vol. 2, No. 11, Nov. 1, 2013, XP055525075, 4 pgs.
Notice of Allowance for Taiwan Patent Application No. 105119970, dated Nov. 13, 2018, 3 pgs.
Office Action for Chinese Patent Application No. 201480062528.X, dated Apr. 16, 2019, 12 pages.
Office Action from Chinese Patent Application No. 201480062528. X, dated Dec. 26, 2019, 5 pgs.

* cited by examiner

MULTI-THRESHOLD VOLTAGE DEVICES AND ASSOCIATED TECHNIQUES AND CONFIGURATIONS

CROSS REFERENCE TO RELATED APPLICATIONS

The present application is a continuation application of U.S. patent application Ser. No. 14/941,291, filed Nov. 13, 2015, which is continuation of U.S. patent application Ser. No. 14/108,265, filed Dec. 16, 2013, now U.S. Pat. No. 9,219,155, the entire contents of which are hereby incorporated by reference for all purposes.

FIELD

Embodiments of the present disclosure generally relate to the field of integrated circuits, and more particularly, to multi-threshold voltage devices and associated techniques and configurations.

BACKGROUND

Transistor leakage and switching speed may be modulated by a threshold voltage ($V_{th}$) of the transistor. Emerging circuits may utilize transistors with multiple threshold voltages to optimize power dissipation and clock frequency. For example, subcircuitry that constrains circuit performance may use lower $V_{th}$ transistors to increase switching speed and subcircuitry that does not constrain circuit performance may use higher $V_{th}$ transistors to reduce power consumption. Traditional methods of modulating threshold voltage of a transistor may be based on doping a channel region with different amounts of impurities. For example, an n-type device may have a higher $V_{th}$ if a greater number of p-type dopants are implanted into the channel. When different transistors are implanted with different levels of channel dopants, different threshold voltages may be realized. However, doping the channel (e.g., by implant) may adversely affect switching speed of a transistor for a given leakage level. Dopant atoms may scatter mobile charge carriers reducing carrier charge mobility. Additionally, transistor performance variation may increase with increasing dopant levels. For example, variation of $V_{th}$ may increase with increased dopant levels due to random dopant fluctuations.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Figure 1:
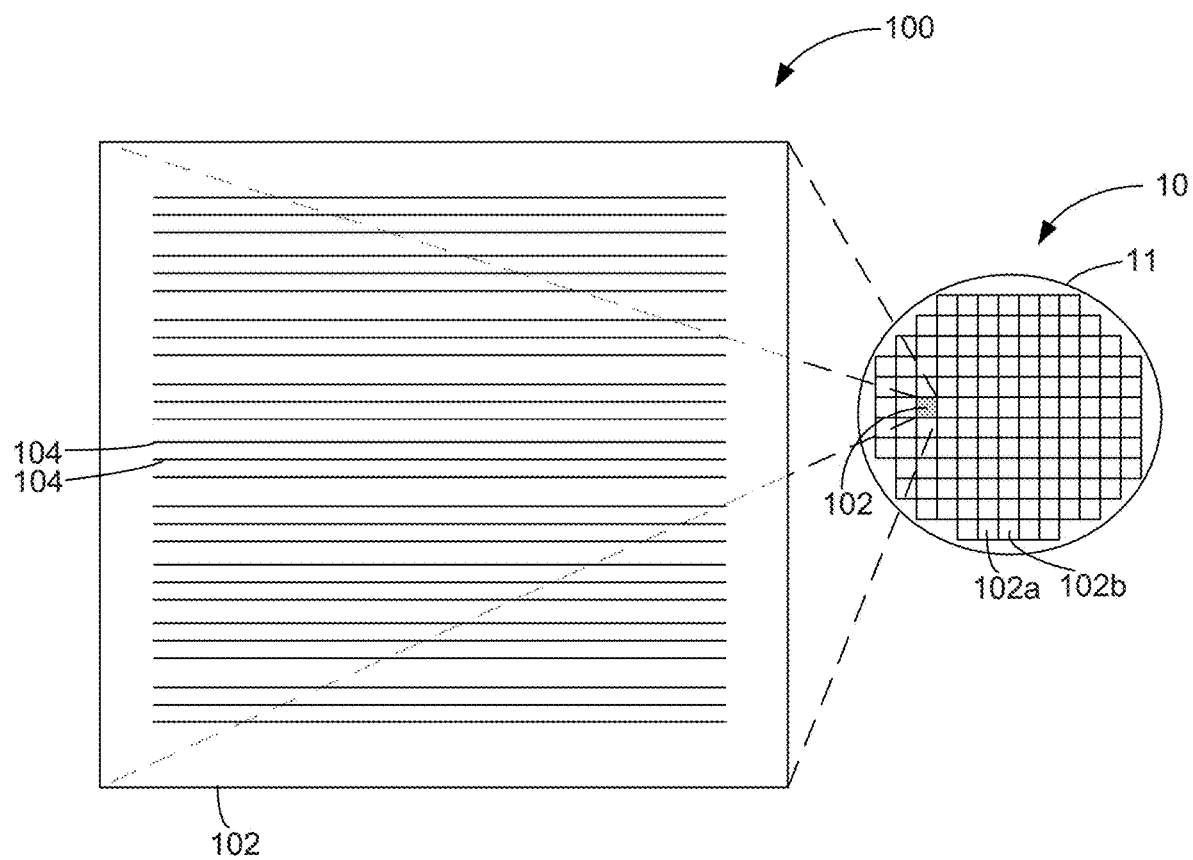
FIG. 1 schematically illustrates a top view of an example die in wafer form and in singulated form, in accordance with some embodiments.

Embodiments of the present disclosure describe multi-threshold voltage devices and associated techniques and configurations. In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use perspective-based descriptions such as top/bottom, side, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

In various embodiments, the phrase "a first feature formed, deposited, or otherwise disposed on a second feature," may mean that the first feature is formed, deposited, or disposed over the second feature, and at least a part of the first feature may be in direct contact (e.g., direct physical and/or electrical contact) or indirect contact (e.g., having one or more other features between the first feature and the second feature) with at least a part of the second feature.

As used herein, the term "module" may refer to, be part of, or include an Application Specific Integrated Circuit (ASIC), an electronic circuit, a processor (shared, dedicated, or group) and/or memory (shared, dedicated, or group) that execute one or more software or firmware programs, a combinational logic circuit, and/or other suitable components that provide the described functionality.

FIG. 1 schematically illustrates a top view of an example die 102 in wafer form 10 and in singulated form 100, in accordance with some embodiments. In some embodiments, the die 102 may be one of a plurality of dies (e.g., dies 102, 102a, 102b) of a wafer 11 composed of semiconductor material such as, for example silicon or other suitable material. The plurality of dies may be formed on a surface of the wafer 11. Each of the dies may be a repeating unit of a semiconductor product that includes multi-threshold voltage transistor devices as described herein. For example, the die 102 may include circuitry having transistor elements such as, for example, one or more channel bodies 104 (e.g., fin structures, nanowires, etc.) that provide a channel pathway for mobile charge carriers in multi-threshold voltage transistor devices. Although the one or more channel bodies 104 are depicted in rows that traverse a substantial portion of the die 102 in FIG. 1, it is to be understood that one or more channel bodies 104 may be configured in any of a wide variety of other suitable arrangements on the die 102 in other embodiments.

After a fabrication process of the semiconductor product embodied in the dies is complete, the wafer 11 may undergo a singulation process in which each of the dies (e.g., die 102) is separated from one another to provide discrete "chips" of the semiconductor product. The wafer 11 may be any of a variety of sizes. In some embodiments, the wafer 11 has a diameter ranging from about 25.4 mm to about 450 mm. The wafer 11 may include other sizes and/or other shapes in other embodiments. According to various embodiments, the one or more channel bodies 104 may be disposed on a semiconductor substrate in wafer form 10 or singulated form 100. The one or more channel bodies 104 described herein may be incorporated in a die 102 for logic or memory, or combinations thereof. In some embodiments, the one or more channel bodies 104 may be part of a system-on-chip (SoC) assembly.

Figure 2:
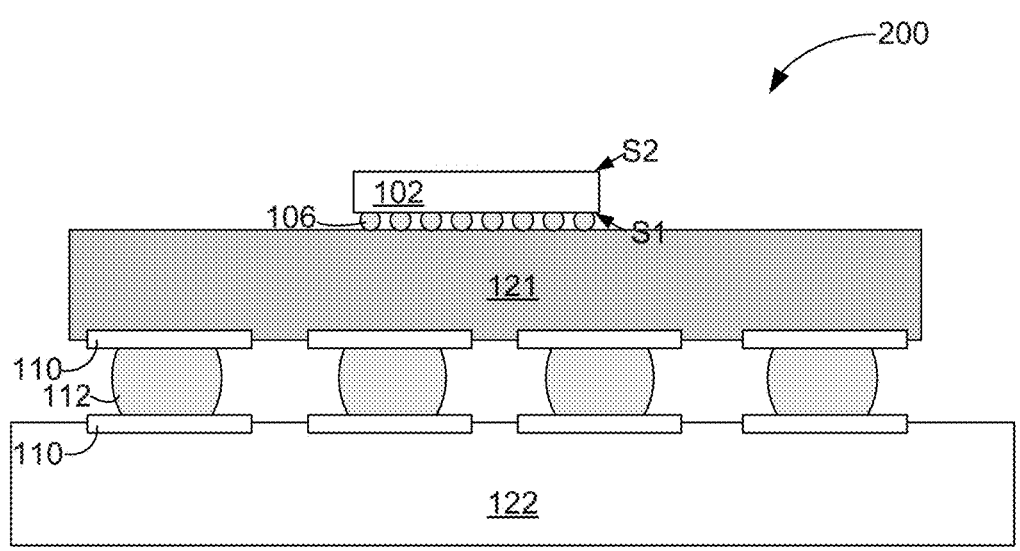
FIG. 2 schematically illustrates a cross-section side view of an integrated circuit (IC) assembly, in accordance with some embodiments.

FIG. 2 schematically illustrates a cross-section side view of an integrated circuit (IC) assembly 200, in accordance with some embodiments. In some embodiments, the IC assembly 200 may include one or more dies (hereinafter "die 102") electrically and/or physically coupled with a package substrate 121. The die 102 may include one or more channel bodies (e.g., one or more channel bodies 104 of FIG. 1) that serve as channel bodies of multi-threshold voltage transistor devices as described herein. In some embodiments, the package substrate 121 may be electrically coupled with a circuit board 122, as can be seen.

The die 102 may represent a discrete product made from a semiconductor material (e.g., silicon) using semiconductor fabrication techniques such as thin film deposition, lithography, etching and the like used in connection with forming CMOS devices. In some embodiments, the die 102 may be, include, or be a part of a processor, memory, SoC or ASIC in some embodiments. In some embodiments, an electrically insulative material such as, for example, molding compound or underfill material (not shown) may encapsulate at least a portion of the die 102 and/or die-level interconnect structures 106.

The die 102 can be attached to the package substrate 121 according to a wide variety of suitable configurations including, for example, being directly coupled with the package substrate 121 in a flip-chip configuration, as depicted. In the flip-chip configuration, an active side, S1, of the die 102 including circuitry is attached to a surface of the package substrate 121 using die-level interconnect structures 106 such as bumps, pillars, or other suitable structures that may also electrically couple the die 102 with the package substrate 121. The active side S1 of the die 102 may include multi-threshold voltage transistor devices as described herein. An inactive side, S2, may be disposed opposite to the active side S1, as can be seen.

In some embodiments, the die-level interconnect structures 106 may be configured to route electrical signals between the die 102 and other electrical devices. The electrical signals may include, for example, input/output (I/O) signals and/or power/ground signals that are used in connection with operation of the die 102.

In some embodiments, the package substrate 121 is an epoxy-based laminate substrate having a core and/or build-up layers such as, for example, an Ajinomoto Build-up Film (ABF) substrate. The package substrate 121 may include other suitable types of substrates in other embodiments including, for example, substrates formed from glass, ceramic, or semiconductor materials.

The package substrate 121 may include electrical routing features configured to route electrical signals to or from the die 102. The electrical routing features may include, for example, pads or traces (not shown) disposed on one or more surfaces of the package substrate 121 and/or internal routing features (not shown) such as, for example, trenches, vias or other interconnect structures to route electrical signals through the package substrate 121. For example, in some embodiments, the package substrate 121 may include electrical routing features such as pads (not shown) configured to receive the respective die-level interconnect structures 106 of the die 102.

The circuit board 122 may be a printed circuit board (PCB) composed of an electrically insulative material such as an epoxy laminate. For example, the circuit board 122 may include electrically insulating layers composed of materials such as, for example, polytetrafluoroethylene, phenolic cotton paper materials such as Flame Retardant 4 (FR-4), FR-1, cotton paper and epoxy materials such as CEM-1 or CEM-3, or woven glass materials that are laminated together using an epoxy resin prepreg material. Interconnect structures (not shown) such as traces, trenches, vias may be formed through the electrically insulating layers to route the electrical signals of the die 102 through the circuit board 122. The circuit board 122 may be composed of other suitable materials in other embodiments. In some embodiments, the circuit board 122 is a motherboard (e.g., motherboard 1002 of FIG. 12).

Package-level interconnects such as, for example, solder balls 112 may be coupled to one or more pads (hereinafter "pads 110") on the package substrate 121 and/or on the circuit board 122 to form corresponding solder joints that are configured to further route the electrical signals between the package substrate 121 and the circuit board 122. The pads 110 may be composed of any suitable electrically conductive material such as metal including, for example, nickel (Ni), palladium (Pd), gold (Au), silver (Ag), copper (Cu), and combinations thereof. Other suitable techniques to physically and/or electrically couple the package substrate 121 with the circuit board 122 may be used in other embodiments.

The IC assembly 200 may include a wide variety of other suitable configurations in other embodiments including, for example, suitable combinations of flip-chip and/or wire-bonding configurations, interposers, multi-chip package configurations including system-in-package (SiP) and/or package-on-package (PoP) configurations. Other suitable techniques to route electrical signals between the die 102 and other components of the IC assembly 200 may be used in some embodiments.

Figure 3:
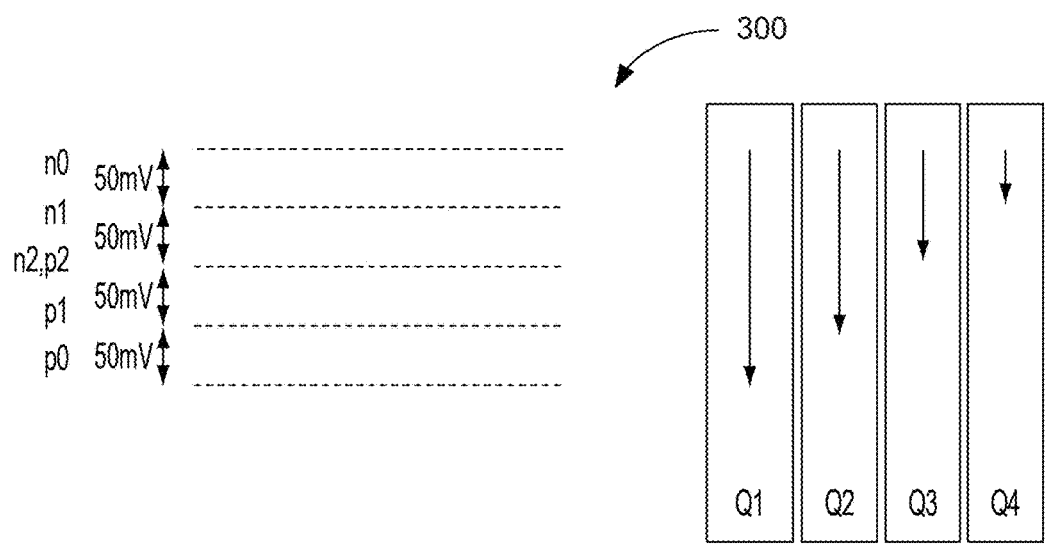
FIG. 3 schematically illustrates an example band diagram for transistor devices with various threshold voltages, in accordance with some embodiments.

FIG. 3 schematically illustrates an example band diagram 300 for transistor devices with various threshold voltages, in accordance with some embodiments. The band diagram 300 may depict workfunction energy levels (in dashed form) corresponding with threshold voltage differences between each of a plurality of multi-threshold transistor devices (hereinafter "devices") n0, n1, n2, p2, p1, p0 formed using silicon. As can be seen, a threshold voltage of device n0 (e.g., nearest a conduction band of silicon) may be less than a threshold voltage of device n1, which may be less than a threshold voltage of device n2. A threshold voltage of device p2 may be less than a threshold voltage of device p1, which may be less than a threshold voltage of device p0 (e.g., nearest a valence band of silicon). In some embodiments, the workfunction of devices n2, p2 may be the same or substantially the same. In some embodiments, a difference between each of the threshold voltages (e.g., between n0 and n1, between n1 and n2, p2, etc.) is from 10 millivolts (mV) to 200 mV or more. In one embodiment, the difference between each of the threshold voltages is about 50 mV. Differences between each of the threshold voltages may have other suitable values in other embodiments.

The variation of threshold voltages of the devices n0, n1, n2, p2, p1, p0 may be achieved using different thicknesses of gate electrode material, which may change a workfunction of the gate instead of or in addition to creating a difference in Fermi level of an underlying channel body by doping. For example, variation of threshold voltages in n-type devices may be achieved by varying a thickness of a p-type gate electrode and variation of threshold voltages in p-type devices may be achieved by varying a thickness of an n-type gate electrode. In the depicted embodiment, for an n-type device array, layers Q1, Q2, Q3 and Q4 may each have a corresponding arrow that represents a different thickness of a p-type workfunction metal (pWFM) formed on a channel body to modulate the threshold voltages of n0, n1, n2/p2, p1 and p0. That is, layer Q1 may have a greatest thickness of pWFM corresponding with device p0, layer Q2 may have a smaller thickness of pWFM relative to layer Q1 and corresponding with device p1, layer Q3 may have a smaller thickness of pWFM relative to layer Q2 and corresponding with devices n2, p2, and layer Q4 may have a smallest thickness of pWFM corresponding with device n1. Device n0 may not have a thickness of pWFM at all and may have an n-type workfunction metal (nWFM) formed on the respective channel body. The pWFM and nWFM may be switched in the above example to provide multi-threshold voltage devices for a p-type device array according to various embodiments. Although the band diagram 300 has been described in connection with silicon, similar principles described herein may be used in connection with other suitable semiconductor materials in other embodiments. Furthermore, suitable electrode materials other than workfunction metals may be used in other embodiments.

Figure 4:
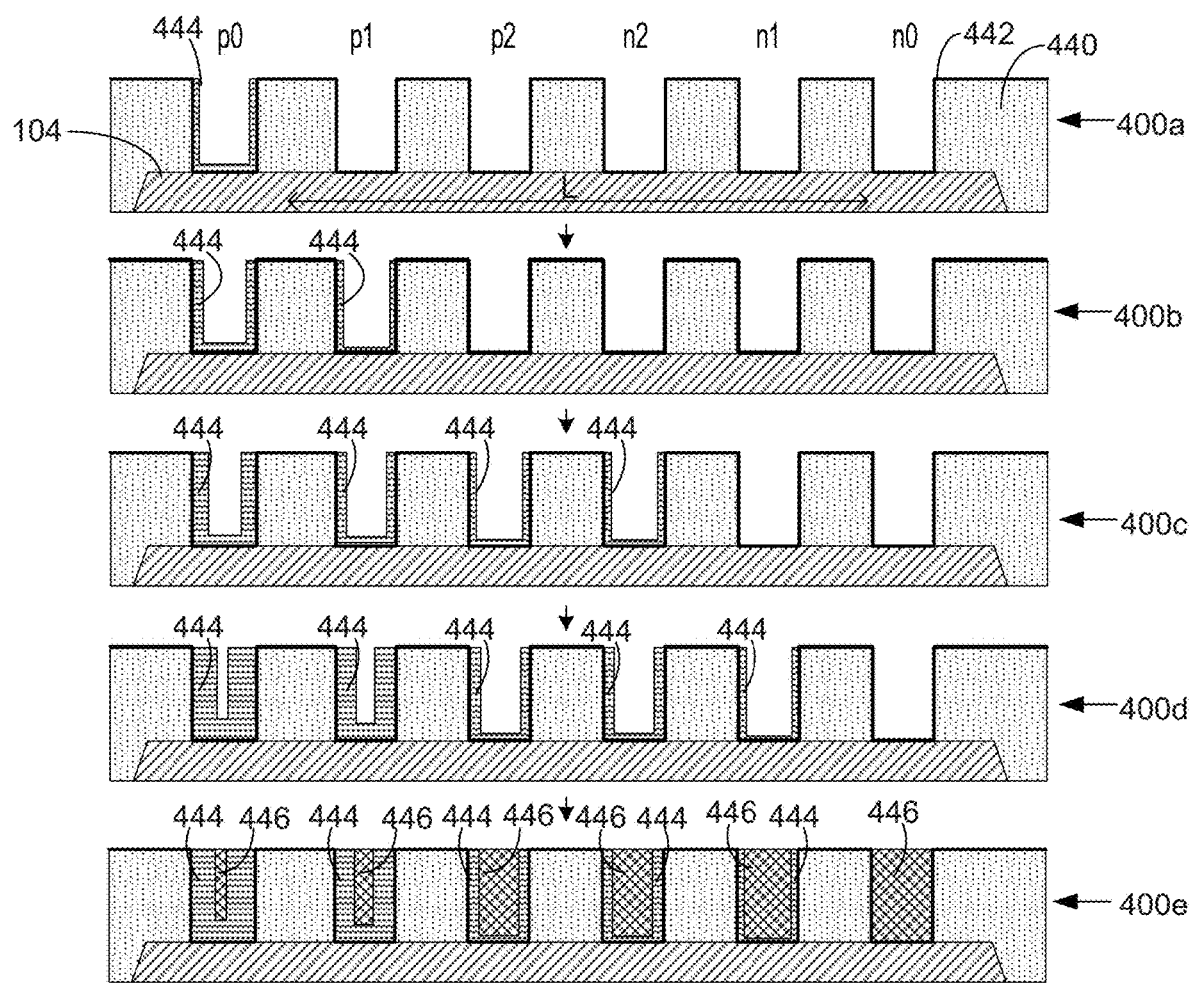
FIG. 4 schematically illustrates a cross-section side view of transistor devices with various threshold voltages during various stages of fabrication, in accordance with some embodiments.

FIG. 4 schematically illustrates a cross-section side view of transistor devices with various threshold voltages during various stages of fabrication, in accordance with some embodiments. Varying thicknesses of gate electrode material may be formed in gate electrode regions (hereinafter "regions") corresponding with devices n0, n1, n2, p2, p1 and p0 to provide varying threshold voltages for devices n0, n1, n2, p2, p1 and p0 according techniques described in connection with FIG. 4. The regions may include openings over the channel body 104 for each of the devices n0, n1, n2, p2, p1 and p0, as can be seen. According to various embodiments, the devices n0, n1, n2, p2, p1 and p0 may correspond with the similarly labeled devices n0, n1, n2, p2, p1 and p0 in FIG. 3.

At 400a, a transistor structure is depicted along a lengthwise direction (e.g., indicated by arrow L) of a channel body 104 subsequent to depositing and patterning a dielectric material 440 to form openings over respective regions of the channel body 104 for the devices n0, n1, n2, p2, p1 and p0, depositing a gate dielectric 442 onto exposed surfaces of the channel body 104 and depositing a thickness of electrode material 444 on the channel body 104 (e.g., on the gate dielectric 442) in a region corresponding with the p0 device. The term "transistor structure" used herein may include a structure that includes portions of multiple transistors in some embodiments. For example, in the depicted embodiment, six transistor gates are represented corresponding with devices n0, n1, n2, p2, p1 and p0. In some embodiments, the channel body 104 in the depicted embodiment may be a fin structure disposed on a semiconductor substrate (e.g., bulk or silicon-on-insulator (SOI)) and the gate dielectric 442 and the electrode material 444 may be further disposed on at least a portion of sidewall surfaces of the fin structure in addition to a top surface of the fin structure. The gate dielectric 442 may include a film that is disposed between the electrode material 444 and the channel body 104. The electrode material 444 may be a workfunction metal that modifies a threshold voltage of a transistor device. In some embodiments, the electrode material 444 may be referred to as a workfunction modifying layer.

According to various embodiments, at 400a, the transistor structure is depicted subsequent to depositing a thickness of electrode material 444 on the channel body 104 in all regions corresponding with respective devices n0, n1, n2, p2, p1 and p0 and removing the electrode material 444 from the regions corresponding with all devices n0, n1, n2, p2, p1 except device p0. An example technique for performing such deposition and removal process at 400a is described in connection with FIG. 5.

Figure 5:
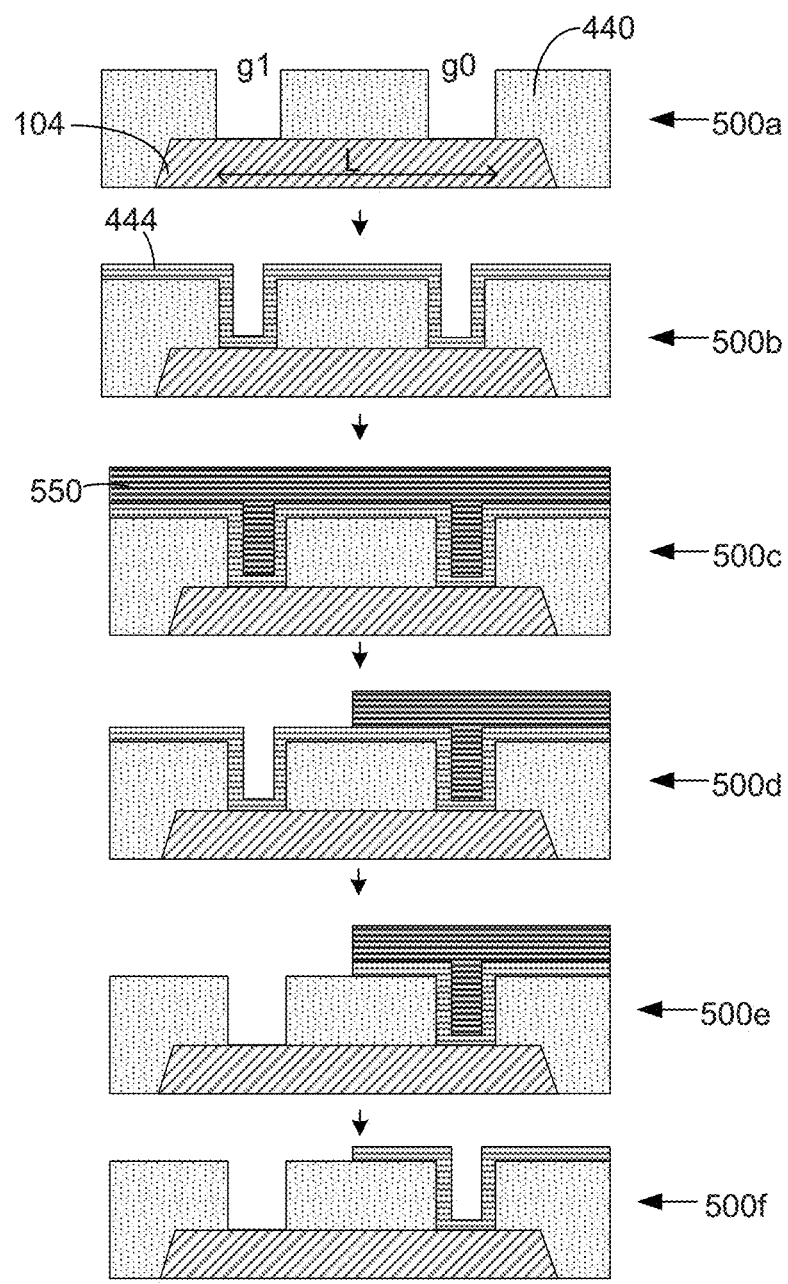
FIG. 5 schematically illustrates an example patterning technique to form the transistor devices of FIG. 4, in accordance with some embodiments.

FIG. 5 schematically illustrates an example patterning technique to form the transistor devices of FIG. 4, in accordance with some embodiments. At 500a, a transistor structure is depicted subsequent to forming openings in dielectric material 440 over a channel body 104 in regions corresponding with device p0 and p1 of FIG. 4. Device g1 may represent one or more of the devices in FIG. 4 where the electrode material is removed. For example, device g1 may represent any one or more of the devices n0, n1, n2, p2 and p1 at 400a, the devices n0, n1, n2 and p2 at 400b, the devices n0 and n1 at 400c, and/or device n0 at 400d. Device g0 may represent one or more of the devices in FIG. 4 where the electrode material remains. A gate dielectric (e.g., gate dielectric 442 of FIG. 4) may be deposited onto the channel body 104 in the openings, but is not shown in FIG. 5 for simplicity.

At 500b, the transistor structure is depicted subsequent to depositing an electrode material 444 onto the channel body 104 in the openings. The deposition of the electrode material 444 may be conformal, as can be seen, in some embodiments.

At 500c, the transistor structure is depicted subsequent to depositing a pattern transfer layer 550 (e.g., photosensitive material) on the electrode material 444.

At 500d, the transistor structure is depicted subsequent to removing a portion of the pattern transfer layer 550 over a region where the underlying electrode material 444 is to be removed. For example, a patterning process such as photolithography or etch processes may be used to expose and remove select portions of the pattern transfer layer 550.

At 500e, the transistor structure is depicted subsequent to etching the electrode material 444 that is not protected by the pattern transfer layer 550. In the depicted embodiment, the electrode material 444 is removed from the channel body 104 in the region of device p1, but remains on the channel body 104 in the region of device p0.

At 500f, the pattern transfer layer 550 may be removed using any suitable technique such as, for example, a photoresist strip process.

Returning again to FIG. 4, at 400b, the transistor structure is depicted subsequent to depositing a thickness of electrode material 444 on the channel body 104 in regions corresponding with respective devices n0, n1, n2, p2, p1 and p0 and removing the electrode material 444 from the regions corresponding with devices n0, n1, n2, p2, but not from regions corresponding with devices p0 and p1. In this manner, another thickness of electrode material 444 is deposited at 400b onto the thickness of the electrode material 444 remaining on the channel body 104 in the region of device p0 at 400a to provide a greater thickness of electrode material 444 in the p0 region than a thickness of electrode material 444 in the p1 region.

The deposition and removal process of electrode material 444 at 400b may comport with embodiments described in connection with actions 500a through 500f in FIG. 5. A thickness of the electrode material 444 that is deposited at each of actions 400a-d may range from ~1 Angstrom to 10 Angstroms in some embodiments. In one embodiment, the thickness of the electrode material 444 that is deposited at each of actions 400a-d is about 5 Angstroms. In such embodiment, at 400b, the thickness of electrode material 444 in the p0 region is about 10 Angstroms and the thickness of electrode material in the p1 region is about 5 Angstroms. Other suitable thicknesses may be used in other embodiments.

At 400c, the transistor structure is depicted subsequent to depositing a thickness of electrode material 444 on the channel body 104 in regions corresponding with respective devices n0, n1, n2, p2, p1 and p0 and removing the electrode material 444 from the regions corresponding with devices n0 and n1, but not from regions corresponding with devices p0, p1, p2 and n2. In this manner, another thickness of electrode material 444 is deposited at 400c onto the thickness of the electrode material 444 remaining on the channel body 104 in the regions of devices p0 and p1 at 400b to provide a greater thickness of electrode material 444 in the p0 region than a thickness of electrode material 444 in the p1 region and a greater thickness of electrode material 444 in the p1 region than a thickness of electrode material 444 in the p2, n2 regions, as can be seen. The deposition and removal process of electrode material 444 at 400c may comport with embodiments described in connection with actions 500a through 500f in FIG. 5.

At 400d, the transistor structure is depicted subsequent to depositing a thickness of electrode material 444 on the channel body 104 in regions corresponding with respective devices n0, n1, n2, p2, p1 and p0 and removing the electrode material 444 from the regions corresponding with device n0, but not from regions corresponding with devices p0, p1, p2, n2 and n1. In this manner, another thickness of electrode material 444 is deposited at 400d onto the thickness of the electrode material 444 remaining on the channel body 104 in the regions of devices p0, p1, p2 and n2 at 400c to provide a greater thickness of electrode material 444 in the p0 region than a thickness of electrode material 444 in the p1 region, a greater thickness of electrode material 444 in the p1 region than a thickness of electrode material 444 in the p2, n2 regions, and a greater thickness of electrode material 444 in the p2, n2 regions than a thickness of electrode material 444 in the n1 region, as can be seen. The deposition and removal process of electrode material 444 at 400d may comport with embodiments described in connection with actions 500a through 500f in FIG. 5.

At 400e, the transistor structure is depicted subsequent to depositing a thickness of another electrode material 446 on the electrode material 444. The electrode material 444 disposed on the channel body 104 in regions corresponding with devices p0, p1, p2, n2 and n1 may have a same chemical composition and the other electrode material 446 may have a chemical composition that is different than the electrode material 444. In some embodiments, the electrode material 444 may be one of an n-type or p-type material and the electrode material 446 may be n-type if the electrode material 444 is p-type or the electrode material 446 may be p-type if the electrode material 444 is n-type. For example, in some embodiments, the electrode material 444 may be pWFM and the electrode material 446 may be nWFM. A thickness of the other electrode material 446 on the channel body 104 in the region of device n0 may be greater than a thickness of the electrode material 444 on the channel body 104 in the regions of devices n1, n2, p2, p1, and p0, as can be seen. In some embodiments, the electrode material 446 may be a fill material and may not be a workfunction metal in some embodiments.

In some embodiments, the other electrode material 444 may fill the openings over the regions corresponding with devices p0, p1, p2, n2, n1 and n0. A planarizing process such as, for example, chemical mechanical polish (CMP) may be used to remove excess amounts of the electrode material 444 and to provide a substantially planar surface.

In some embodiments, the channel body 104 may be composed of undoped semiconductor material. That is, modulation of threshold voltage for transistors (e.g., devices n0, n1, n2, p2, p1 and p0) may be accomplished solely by varying thickness of the electrode material 444 without implanting the channel body 104 with n-type or p-type impurities, which may result in transistors (e.g., FINFET transistors) having greater switching speed for a given leakage level, greater carrier mobility and reduced transistor performance variation.

In some embodiments, a thickness of the electrode material 444 generally increases or stays the same in a first direction parallel with the lengthwise direction (e.g., indicated by arrow L) of the channel body 104 and generally decreases or stays the same in a second direction that is perpendicular with the first direction, as can be seen. For example, at 400c-e, the electrode material 444 on the channel body 104 in the region of device p1 may be disposed between the electrode material 444 on the channel body 104 in the region of device p0 and p2 and may have a thickness that is greater than the electrode material 444 on the channel body 104 in the region of device P2 and smaller than the electrode material 444 on the channel body 104 in the region of device p0. In some embodiments a thickness of the electrode material 444 of device p0 at 400e is equal to 30 Angstroms or less. Other suitable thicknesses may be used in other embodiments.

Other suitable techniques to provide a variation of thickness of electrode material 444 may be used in other embodiments including, for example, patterning processes that allow selective deposition in p0 device region at 400a, selective deposition in p0 and p1 at 400b, and so forth. For example, a mask or other protective barrier may be used to protect regions of devices p1, p2, n2, n1 and n0 during deposition of electrode material 444 at 400a and to protect regions of devices p2, n2, n1, and n0 during deposition of electrode material 444 at 400b, and so forth.

Figure 6:
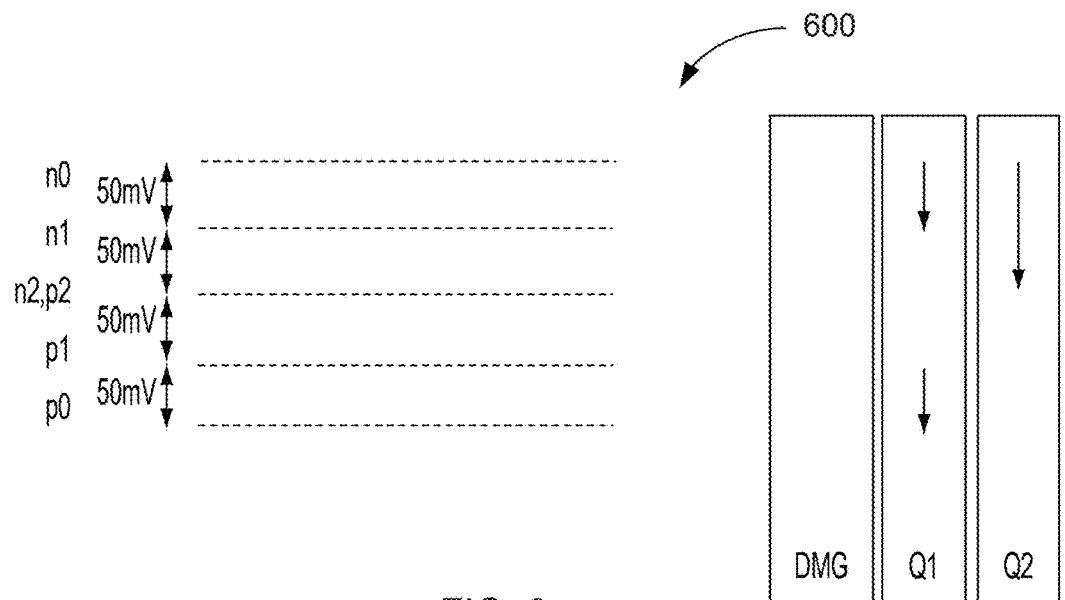
FIG. 6 schematically illustrates another example band diagram for transistor devices with various threshold voltages, in accordance with some embodiments.

FIG. 6 schematically illustrates another example band diagram 600 for transistor devices with various threshold voltages, in accordance with some embodiments. The band diagram 600 may depict workfunction energy levels (in dashed form) corresponding with threshold voltage differences between each of a plurality of multi-threshold devices n0, n1, n2, p2, p1, p0 formed using silicon. As can be seen, a threshold voltage of device n0 (e.g., nearest a conduction band of silicon) may be less than a threshold voltage of device n1, which may be less than a threshold voltage of device n2. A threshold voltage of device p2 may be less than a threshold voltage of device p1, which may be less than a threshold voltage of device p0 (e.g., nearest a valence band of silicon). In some embodiments, the workfunction of devices n2, p2 may be the same or substantially the same. In some embodiments, a difference between each of the threshold voltages (e.g., between n0 and n1, between n1 and n2, p2, etc.) is from 10 millivolts (mV) to 200 mV or more. In one embodiment, the difference between each of the threshold voltages is about 50 mV. Differences between each of the threshold voltages may have other suitable values in other embodiments.

The variation of threshold voltages of the devices n0, n1, n2, p2, p1, p0 may be achieved using different thicknesses of gate electrode material, which may change a workfunction of the gate instead of or in addition to creating a difference in Fermi level of an underlying channel body by doping. For example, variation of threshold voltages in n-type devices may be achieved by varying a thickness of a p-type gate electrode (e.g., workfunction modifiying layer) and variation of threshold voltages in p-type devices may be achieved by varying a thickness of an n-type gate electrode (e.g., workfunction modifiying layer). For example, threshold voltage of n-type devices may be modified by inserting thin layers of p-type work function metal in another otherwise n-type workfunction metal stack (e.g., n-type workfunction fill material).

In the depicted embodiment, for an n-type device array, layers Q1 and Q2 may each have a corresponding arrow(s) that represents a different thickness of a p-type workfunction metal (pWFM) formed on a channel body to modulate the threshold voltages of n0, n1, n2/p2, p1 and p0. That is, layer Q1 may represent deposition of a same thickness of pWFM in two regions and layer Q2 may represent a deposition of a thickness of pWFM that is greater than a thickness of layer Q1 in a single region of the two regions. The layer DMG may not have a thickness of pWFM at all and may represent a layer of sacrificial material used to provide a replacement nWFM as described in connection with FIG. 8. The pWFM and nWFM may be switched in the above example to provide multi-threshold voltage devices for a p-type device array according to various embodiments. Although the band diagram 600 has been described in connection with silicon, similar principles described herein may be used in connection with other suitable semiconductor materials in other embodiments. Furthermore, suitable electrode materials other than workfunction metals may be used in other embodiments.

Figure 7:
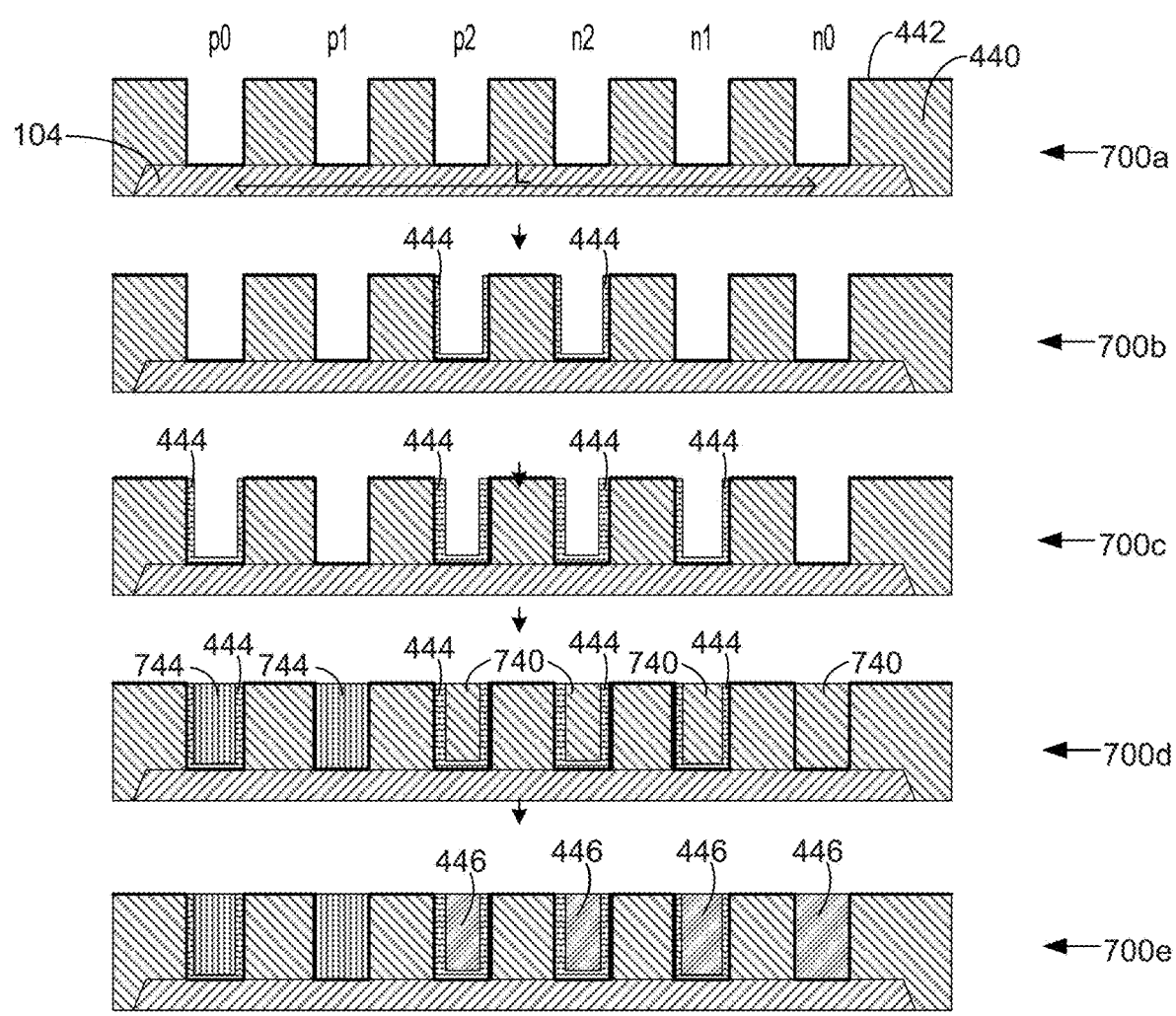
FIG. 7 schematically illustrates a cross-section side view of transistor devices with various threshold voltages during various stages of fabrication, in accordance with some embodiments.

FIG. 7 schematically illustrates a cross-section side view of transistor devices with various threshold voltages during various stages of fabrication, in accordance with some embodiments. Varying thicknesses of gate electrode material may be formed in regions corresponding with devices n0, n1, n2, p2, p1 and p0 to provide varying threshold voltages for devices n0, n1, n2, p2, p1 and p0 according techniques described in connection with FIG. 7. According to various embodiments, the devices n0, n1, n2, p2, p1 and p0 may correspond with the similarly labeled devices n0, n1, n2, p2, p1 and p0 in FIG. 6. Not all numeric labels are repeated in each of the actions 700a through 700e for the sake of clarity and simplicity.

At 700a, a transistor structure is depicted along a lengthwise direction (e.g., indicated by arrow L) of a channel body 104 subsequent to depositing and patterning a dielectric material 440 to form openings over respective regions of the channel body 104 for the devices n0, n1, n2, p2, p1 and p0 and depositing a gate dielectric 442 onto exposed surfaces of the channel body 104. In some embodiments, the channel body 104 in the depicted embodiment may be a fin structure disposed on a semiconductor substrate (e.g., bulk or silicon-on-insulator (SOI)). The exposed surfaces of the channel body 104 may include, for example, top surfaces and at least a portion of opposing sidewall surfaces of each fin structure in the region where openings are formed in the dielectric material 440. The gate dielectric 442 may be disposed on at least a portion of sidewall surfaces of the fin structure in addition to a top surface of the fin structure. In some embodiments, the gate dielectric 442 may be conformally deposited to form a film of substantially uniform thickness on exposed surfaces of the transistor structure including on the channel body 104 and the dielectric material 440. The gate dielectric 442 may comport with embodiments described in connection with FIG. 4 and vice versa.

At 700b, the transistor structure is depicted subsequent to depositing a thickness of electrode material 444 on the channel body 104 (e.g., on the gate dielectric 442) in a region corresponding with the devices p2 and n2. In some embodiments, a thickness of electrode material 444 may be deposited on the channel body 104 in all regions corresponding with respective devices n0, n1, n2, p2, p1 and p0 and removing the electrode material 444 from the regions corresponding with all devices n0, n1, n2, p2, p1 except devices p2 and n2. The deposition of the electrode material 444 at 700b may correspond with the Q1 layer of FIG. 6. The deposition and removal process of electrode material 444 at 700b may comport with embodiments described in connection with actions 500a through 500f in FIG. 5.

At 700c, the transistor structure is depicted subsequent to depositing a thickness of electrode material 444 on the channel body 104 in regions corresponding with respective devices n0, n1, n2, p2, p1 and p0 and removing the electrode material 444 from the regions corresponding with devices n0 and p1 but not from regions corresponding with devices p0, p2, n2 and n1. In this manner, another thickness of electrode material 444 is deposited at 700c onto the thickness of the electrode material 444 remaining on the channel body 104 in the region of devices p2, n2 at 700b to provide a greater thickness of electrode material 444 in the p2 and n2 regions than a thickness of electrode material 444 in the p0 and n1 regions. The deposition of the electrode material 444 at 700c may correspond with the Q2 layer of FIG. 6.

The deposition and removal process of electrode material 444 at 700c may comport with embodiments described in connection with actions 500a through 500f in FIG. 5. A thickness of the electrode material 444 that is deposited at each of actions 700b and 700c may range from ~1 Angstrom to 25 Angstroms in some embodiments. In some embodiments, the thickness of the electrode material 444 that is deposited at each of actions 700b and 700c is 3 Angstroms to 10 Angstroms. In one embodiment, the thickness of the electrode material 444 that is deposited at each of actions 700b and 700c is about 5 Angstroms. In such embodiment, at 700c, the thickness of electrode material 444 in the p2 and n2 regions is about 10 Angstroms and the thickness of electrode material in the p0 and n1 regions is about 5 Angstroms. Other suitable thicknesses may be used in other embodiments.

At 700d, the transistor structure is depicted subsequent to depositing another electrode material 744 in regions p0 and p1 and a sacrificial material 740 in regions p2, n2, n1 and n0. In some embodiments, the electrode material 444 disposed on the channel body 104 in regions corresponding with devices p0, p2, n2 and n1 may have a same chemical composition. In some embodiments, the electrode material 444 is a p-type material (e.g., pWFM) and the other electrode material 744 may be any suitable material to serve as a fill material of a pWFM stack including, for example, n-type or p-type materials that are more n-type (e.g., farther from valence band edge) relative to the electrode material 444. In a case where the electrode material 444 is an n-type material, the other electrode material 744 may be any suitable material to serve as a fill material of a nWFM stack including, for example, n-type or p-type materials that are more p-type (e.g., closer to valence band edge) relative to the electrode material 444. In some embodiments, the other electrode material 744 may be a composite material that provides a desired workfunction according to a workfunction energy level of the composite material. In some embodiments, the other electrode material 744 may be a same material as electrode material 444 such that devices p0 and p1 have a same workfunction. The sacrificial material 740 may include any suitable sacrificial material including, for example, silicon oxide.

Figure 8:
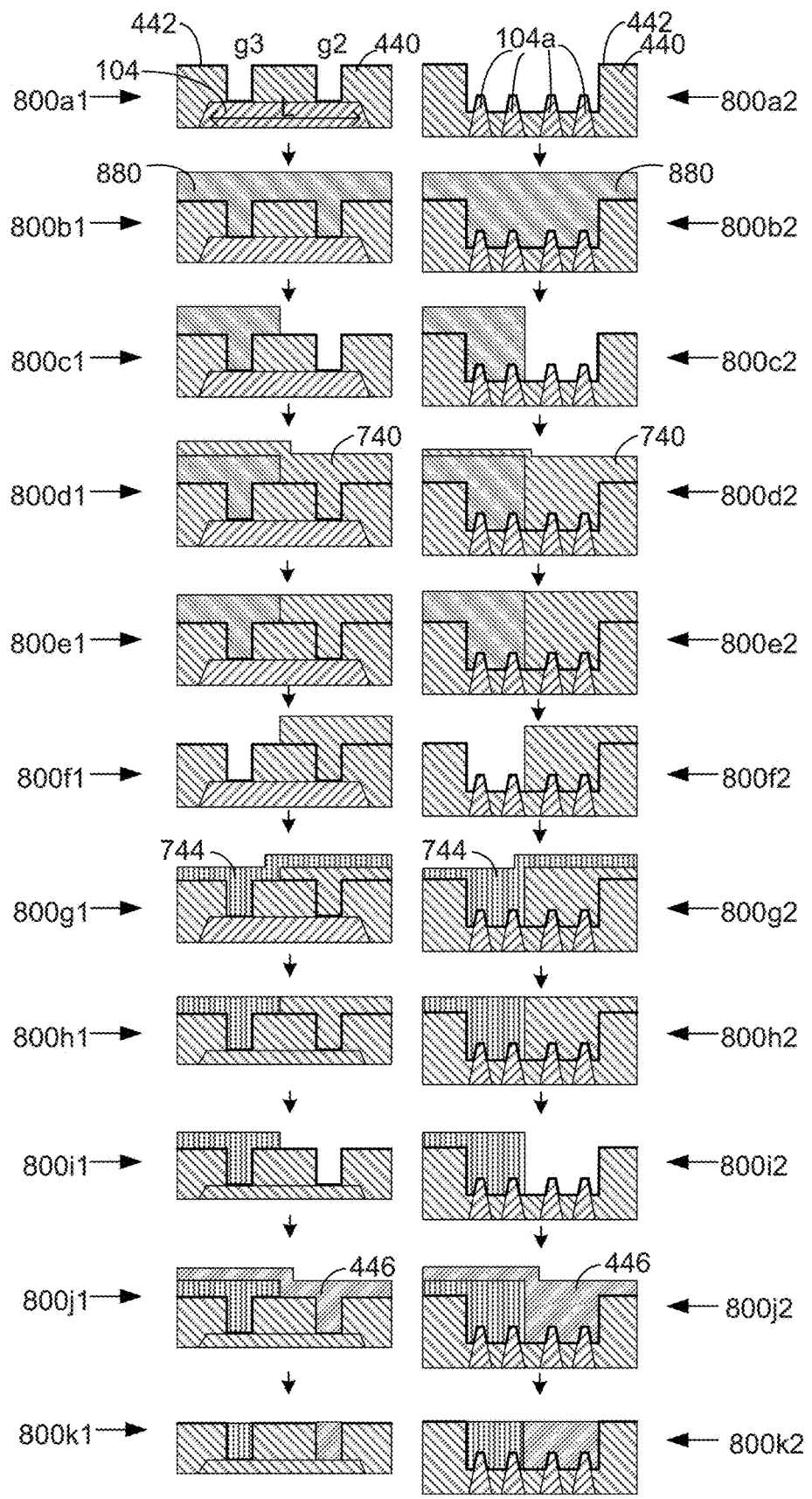
FIG. 8 schematically illustrates an example patterning technique to form the transistor devices of FIG. 7, in accordance with some embodiments.

An example technique for making the transistor structure depicted at 700d from the transistor structured depicted at 700c is described in connection with FIG. 8. FIG. 8 schematically illustrates an example patterning technique to form the transistor devices of FIG. 7, in accordance with some embodiments. The transistor structures depicted at 800a1, 800b1, 800c1, 800d1, 800e1, 800f1, 800g1, 800h1, 800i1, 800j1 and 800k1 are cross-section side views along a lengthwise direction of a single channel body 104 while the transistor structures depicted at 800a2, 800b2, 800c2, 800d2, 800e2, 800f2, 800g2, 800h2, 800i2, 800j2 and 800k2 are cross-section side views perpendicular to the lengthwise direction and depicting multiple channel bodies 104a adjacent to one another. For example, the channel body 104 depicted at 800a1 may be one of the channel bodies 104a at 800a2. The transistor structure at 800a1 and 800a2 may be at a same stage of fabrication, and so forth for 800b1 and 800b2, 800c1 and 800c2, etc. The transistor structure may have more or fewer channel bodies 104 than depicted in other embodiments. Not all numeric labels are repeated in the depictions of FIG. 8 for the sake of clarity and simplicity.

At 800a1 and 800a2, a transistor structure is depicted subsequent to forming openings in dielectric material 440 over regions corresponding with devices g2 and g3 and depositing a gate dielectric 442 on exposed surfaces of the channel body 104 or channel bodies 104a. The device g2 may represent any device that is configured to receive the sacrificial material 740 and the device g3 may represent any device that is configured to receive the electrode material 744. For example, the device g2 may represent devices p2, n2, n1 and n0 and the device g3 may represent devices p0 and p1 at 700d of FIG. 7. In some embodiments, the device g3 and/or g2 may have electrode material 444 disposed in the respective openings at 800a1 and 800a2. For example, the device g3 at 800a1 and 800a2 may represent the p0 device at 700c or the device g2 at 800a1 and 800a2 may represent the p2, n2, n1 devices at 700c. Subsequent actions of FIG. 8 may be performed on the devices g2 and/or g3 having thicknesses of electrode material 444 described in connection with 700c.

At 800b1 and 800b2, the transistor structure is depicted subsequent to depositing a pattern transfer layer 880 on the dielectric material 440 to fill the openings in regions of devices g2 and g3. In some embodiments, the pattern transfer layer 880 may comprise carbon and may be referred to as a carbon underlayer. The pattern transfer layer may be composed of other suitable materials in other embodiments, including, for example, silicon oxide, photoresist materials and the like.

At 800c1 and 800c2, the transistor structure is depicted subsequent to removing material of the pattern transfer layer 800 from the opening over the device g2 and/or any other openings that are configured to receive the sacrificial material 740. The pattern transfer layer 800 may be removed using any suitable patterning process including, for example, lithography and/or etch processes. The removal process at 800c1 and 800c2 does not substantially remove electrode material 444, if any, in the openings of devices g2 and g3.

At 800d1 and 800d2, the transistor structure is depicted subsequent to depositing sacrificial material 740 in the opening over the device g2 and/or any other openings where the pattern transfer layer 800 has been removed.

At 800e1 and 800e2, the transistor structure is depicted subsequent to performing a polish process or other suitable process to expose the pattern transfer layer 880. The polish process may provide a substantially planar surface of the sacrificial material 740 and the pattern transfer layer 880, as can be seen.

At 800f1 and 800f2, the transistor structure is depicted subsequent to removing the pattern transfer layer 880 in the region of device g3. The pattern transfer layer may be removed by any suitable process including, for example, a selective etch process that is configured to remove material of the pattern transfer layer 880 while leaving the material of the sacrificial material 740. The removal process at 800f1 and 800f2 does not substantially remove electrode material 444, if any, in the openings of devices g2 and g3.

At 800g1 and 800g2, the transistor structure is depicted subsequent to depositing electrode material 744 in the openings where pattern transfer layer 880 has been removed. In some embodiments, the electrode material 744 may be a PMOS gate stack material. The electrode material 744 may be deposited on any electrode material 444, if any, in the openings of devices g2 and g3.

At 800h1 and 800h2, the transistor structure is depicted subsequent to a polishing process or other suitable process that removes material of the deposited electrode material 744 to expose underlying material of the sacrificial material 740 in the region of device g2. The transistor structure at 800h1 and 800h2 may represent the same stage of fabrication as the transistor structure 700d of FIG. 7.

Referring again to FIG. 7, at 700e, the transistor structure is depicted subsequent to replacing the sacrificial material 740 with another electrode material 446. In some embodiments, the electrode material 444 may be one of an n-type or p-type material and the electrode material 446 may be n-type if the electrode material 444 is p-type or the electrode material 446 may be p-type if the electrode material 444 is n-type. For example, in some embodiments, the electrode material 444 may be pWFM and the electrode material 446 may be nWFM. In some embodiments, the electrode material 446 may have a different chemical composition than electrode material 744. A thickness of the other electrode material 446 on the channel body 104 in the region of device n0 may be greater than a thickness of the electrode material 444 on the channel body 104 in the regions of devices n1, n2, p2 and p0, as can be seen. According to various embodiments, the transistor structure at 700e may be formed according to techniques described in connection with actions at 800i1, 800i2 through 800k1, 800k2 of FIG. 8.

Referring again to FIG. 8, at 800i1 and 800i2, the transistor structure is depicted subsequent to removing the sacrificial material 740 from the region of the device g2. The sacrificial material 740 may be removed using any suitable process including, for example a selective etch process that removes only the sacrificial material 740. The removal process at 800i1 and 800i2 does not substantially remove electrode material 444, if any, in the openings of devices g2 and g3.

At 800j1 and 800j2, the transistor structure is depicted subsequent to depositing another electrode material 446 in the region of device g2 where the sacrificial material 740 has been removed. The electrode material 446 may be deposited on any electrode material 444, if any, in the openings of devices g2 and g3.

At 800k1 and 800k2, the transistor structure is depicted subsequent to removing and planarizing the electrode materials 446 and 744. The removing and planarizing may be performed, for example, using a polish process or any other suitable technique.

In some embodiments, the techniques of FIG. 8 may be further simplified by using a material for the pattern transfer layer 880 that can withstand deposition of electrode material. For example, at 800d1 and 800d2, the electrode material 446 or 744 may be deposited instead of sacrificial material 740 and the other of the electrode material 446 or 744 that is not deposited at 800d1 and 800d2 may be deposited at 800g1 and 800g2 according to various embodiments.

Figure 9:
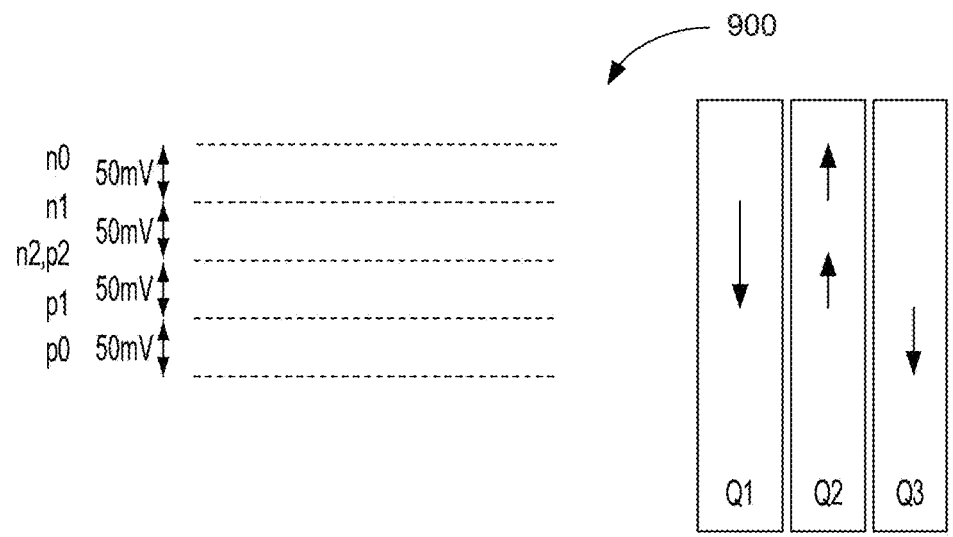
FIG. 9 schematically illustrates yet another example band diagram for transistor devices with various threshold voltages, in accordance with some embodiments.

FIG. 9 schematically illustrates yet another example band diagram 900 for transistor devices with various threshold voltages, in accordance with some embodiments. The band diagram 900 may depict workfunction energy levels (in dashed form) corresponding with threshold voltage differences between each of a plurality of multi-threshold devices n0, n1, n2, p2, p1, p0 formed using silicon. As can be seen, a threshold voltage of device n0 (e.g., nearest a conduction band of silicon) may be less than a threshold voltage of device n1, which may be less than a threshold voltage of device n2. A threshold voltage of device p2 may be less than a threshold voltage of device p1, which may be less than a threshold voltage of device p0 (e.g., nearest a valence band of silicon). In some embodiments, the workfunction of devices n2, p2 may be the same or substantially the same. In some embodiments, a difference between each of the threshold voltages (e.g., between n0 and n1, between n1 and n2, p2, etc.) is from 10 millivolts (mV) to 200 mV or more. In one embodiment, the difference between each of the threshold voltages is about 50 mV. Differences between each of the threshold voltages may have other suitable values in other embodiments.

The variation of threshold voltages of the devices n0, n1, n2, p2, p1, p0 may be achieved using different thicknesses of gate electrode material, which may change a workfunction of the gate instead of or in addition to creating a difference in Fermi level of an underlying channel body by doping. For example, variation of threshold voltages in n-type devices may be achieved by varying a thickness of a p-type gate electrode and variation of threshold voltages in p-type devices may be achieved by varying a thickness of an n-type gate electrode.

In the depicted embodiment, for an n-type device array, layers Q1 and Q2 may each have a corresponding arrow that represents a different thickness of a p-type workfunction metal (pWFM) formed on a channel body to modulate the threshold voltages of n0, n1, n2/p2, p1 and p0. The arrows of layers Q1 and Q3 may represent deposition of a thickness of pWFM and the arrows of layer Q2 may represent deposition of a thickness of nWFM. The pWFM and nWFM may be switched in the above example to provide multi-threshold voltage devices for a p-type device array according to various embodiments. Although the band diagram 900 has been described in connection with silicon, similar principles described herein may be used in connection with other suitable semiconductor materials in other embodiments. Furthermore, suitable electrode materials other than workfunction metals may be used in other embodiments.

Figure 10:
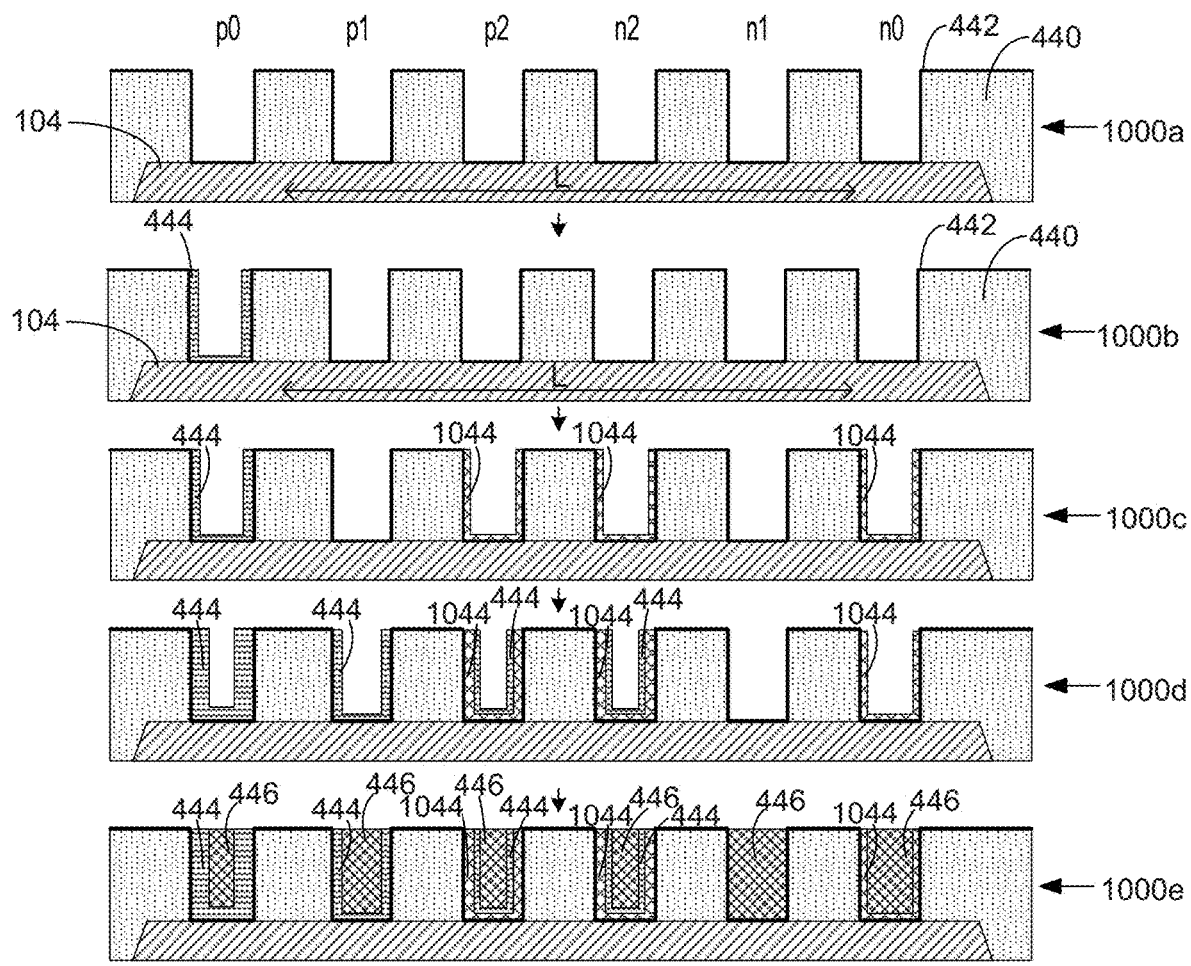
FIG. 10 schematically illustrates a cross-section side view of transistor devices with various threshold voltages during various stages of fabrication, in accordance with some embodiments.

FIG. 10 schematically illustrates a cross-section side view of transistor devices with various threshold voltages during various stages of fabrication, in accordance with some embodiments. At 1000a and 1000b, a transistor structure depicted subsequent to actions described in connection with respective actions at 700a and 700b of FIG. 7 and/or actions at 400a of FIG. 4. At 1000b, the transistor structure is depicted subsequent to depositing a thickness of electrode material 444 in the region of the p0 device. The thickness of electrode material 444 at 1000b may correspond with the layer Q3 of FIG. 9.

At 1000c, the transistor structure is depicted subsequent to depositing a thickness of another electrode material 1044 in the regions of the p2, n2 and n0 devices. The thickness of the electrode material 1044 deposited at 1000c may correspond with the layer Q2 of FIG. 9. For example, in some embodiments, the electrode material 1044 may be deposited in regions of all the devices p0, p1, p2, n2, n1 and n0 and subsequently removed from only regions of p0, p1 and n1 devices according to techniques described herein (e.g., FIG. 5). In some embodiments, an etch process may selectively remove the electrode material 1044 without substantially removing the electrode material 444.

At 1000d, the transistor structure is depicted subsequent to depositing another thickness of the electrode material 444 in the regions of the p0, p1, p2, and n2 devices. The thickness of the electrode material 1044 deposited at 1000d may correspond with the layer Q1 of FIG. 9. For example, in some embodiments, the electrode material 444 may be deposited in regions of all the devices p0, p1, p2, n2, n1 and n0 and subsequently removed from only regions of n1, n0 devices according to techniques described herein (e.g., FIG. 5). In some embodiments, an etch process may selectively remove the electrode material 444 without substantially removing the electrode material 1044 (e.g., from region of device n0).

At 1000e, the transistor structure is depicted subsequent to depositing another electrode material 446 to fill a remaining region, if any, in the regions of the devices p0, p1, p2, n2, n1 and n0. In some embodiments, the electrode material 444 is a p-type material such as pWFM, the electrode material 446 is an n-type material such as nWFM and the electrode material 1044 is an n-type material. In some embodiments, the electrode material 446 may be an n-type or p-type material that provides a fill material that is more p-type than electrode material 1044 and more n-type than electrode material 444. Dimensions of the thicknesses for the deposition actions described in connection with FIG. 10 may comport with embodiments described in connection with FIGS. 4 and 7.

Figure 11:
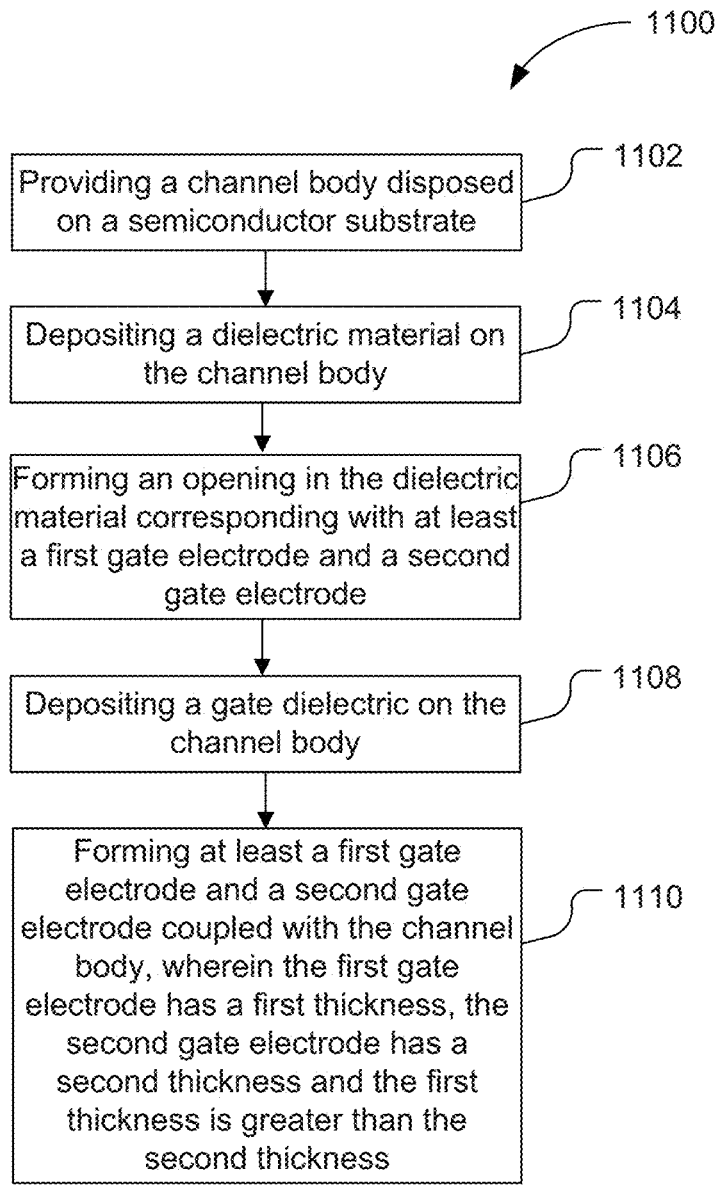
FIG. 11 schematically illustrates a flow diagram for a method of fabricating transistor devices with various threshold voltages, in accordance with some embodiments.

FIG. 11 schematically illustrates a flow diagram for a method 1100 of fabricating transistor devices with various threshold voltages, in accordance with some embodiments. The method 1100 may comport with various techniques and configurations described in connection with FIGS. 3-8 and vice versa, according to various embodiments.

At 1102, the method 1100 may include providing a channel body (e.g., channel body 104 of FIGS. 4-5 and 7-8) disposed on a semiconductor substrate (e.g., die 102). The channel body may include, for example, a fin structure or any other suitable channel body which may benefit from principles described herein. In some embodiments, providing the channel body may include forming the channel body by, for example, patterning and etching a semiconductor material to form fin structures in the semiconductor material.

At 1104, the method 1100 may include depositing a dielectric material (e.g., dielectric material 440 of FIGS. 4-5 and 7-8) on the channel body. The dielectric material may include any suitable material and may be deposited using any suitable technique.

At 1106, the method 1100 may include forming openings in the dielectric material corresponding with at least a first gate electrode and a second gate electrode. The openings may expose portions of the channel body and may correspond with openings formed in regions of two or more of devices n0, n1, n2, p2, p1 and p0 of FIGS. 4 and 7. The openings may be formed using any suitable technique including patterning such as lithography and/or etch.

At 1108, the method 1100 may include depositing a gate dielectric (e.g., gate dielectric 442) on the channel body. In some embodiments, the gate dielectric is deposited on exposed surfaces of the channel body in the openings formed at 1106. The gate dielectric may be deposited using any suitable technique. According to various embodiments, the gate dielectric may be formed of a material such as silicon dioxide (SiO2) or a high-k material. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

According to various embodiments, for a PMOS transistor, metals that may be used for the gate electrode (e.g., electrode material 444) include, but are not limited to, ruthenium, palladium, platinum, cobalt, nickel, and conductive metal oxides, e.g., ruthenium oxide. A p-type metal layer may enable the formation of a PMOS gate electrode with a workfunction that is between about 4.9 eV and about 5.2 eV. For an NMOS transistor, metals that may be used for the gate electrode (e.g., electrode material 446) include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer may enable the formation of an NMOS gate electrode with a workfunction that is between about 3.9 eV and about 4.2 eV. Other suitable materials may be used to form the gate electrodes in other embodiments.

At 1110, the method 1100 may include forming a first gate electrode and a second gate electrode coupled with the channel body, wherein the first gate electrode has a first thickness, the second gate electrode has a second thickness and the first thickness is greater than the second thickness. The first gate electrode and the second gate electrode may be formed according to any of the techniques described in connection with FIGS. 3-8. For example, the first gate electrode may be a workfunction electrode (e.g., electrode material 444 of FIGS. 4-5 and 7-8) formed in the openings of the devices p0, p1, p2, n2, n1 and n0 that has a thickness that is greater than another workfunction electrode (e.g., electrode material 444 of FIGS. 4-5 and 7-8) formed in the openings of the devices p0, p1, p2, n2, n1 and n0. In some embodiments, three or more gate electrodes may be formed according to techniques described herein to provide varying threshold voltages of the devices.

In some embodiments, forming the first gate electrode and the second gate electrode may include simultaneously depositing an electrode material (e.g., electrode material 444 of FIGS. 4-5 and 7-8) in a first region of the first gate electrode and a second region of the second gate electrode as part of a first deposition. The electrode material may be selectively removed in the second region using any suitable technique including, for example, patterning techniques. The electrode material be simultaneously deposited in the first region and the second region as part of a second deposition subsequent to selectively removing the electrode material in the second region.

In some embodiments, actions at 1110 may include forming a third gate electrode coupled with the fin structure, the third gate electrode having a third thickness that is smaller than the second thickness. In some embodiments, actions at 1110 may include forming a fourth gate electrode having a fourth thickness coupled with the fin structure. The fourth thickness (e.g., thickness of electrode material 446 at n0 in FIG. 4) may be greater than the first thickness and may be composed of another electrode material (e.g., electrode material 446 of FIG. 4) having a different chemical composition than the electrode material.

In some embodiments, another electrode material (e.g., electrode material 446 of FIG. 4) may be deposited on the electrode material of the first gate electrode and the second gate electrode. In some embodiments, the other electrode material may fill a remainder of the opening that is not filled by the electrode material.

In some embodiments, no doping process (e.g., implantation of impurities) may be performed on the channel body to modulate a threshold voltage of one or more transistors. Modulation of the threshold voltage may be solely accomplished using varying thicknesses of workfunction material (e.g., electrode material 444) in some embodiments. In some embodiments, forming the first gate electrode comprises replacing a sacrificial material with material of the first gate electrode (e.g., as described in connection with FIGS. 7-8). In some embodiments, a third gate electrode may be formed on the first gate electrode and a fourth gate electrode may be formed on the third gate electrode, wherein material of the fourth gate electrode is a fill material that is more p-type than material of the first gate electrode and more n-type than material of the third gate electrode (e.g., as described in connection with FIG. 10).

Various operations are described as multiple discrete operations in turn, in a manner that is most helpful in understanding the claimed subject matter. However, the order of description should not be construed as to imply that these operations are necessarily order dependent. Embodiments of the present disclosure may be implemented into a system using any suitable hardware and/or software to configure as desired.

Figure 12:
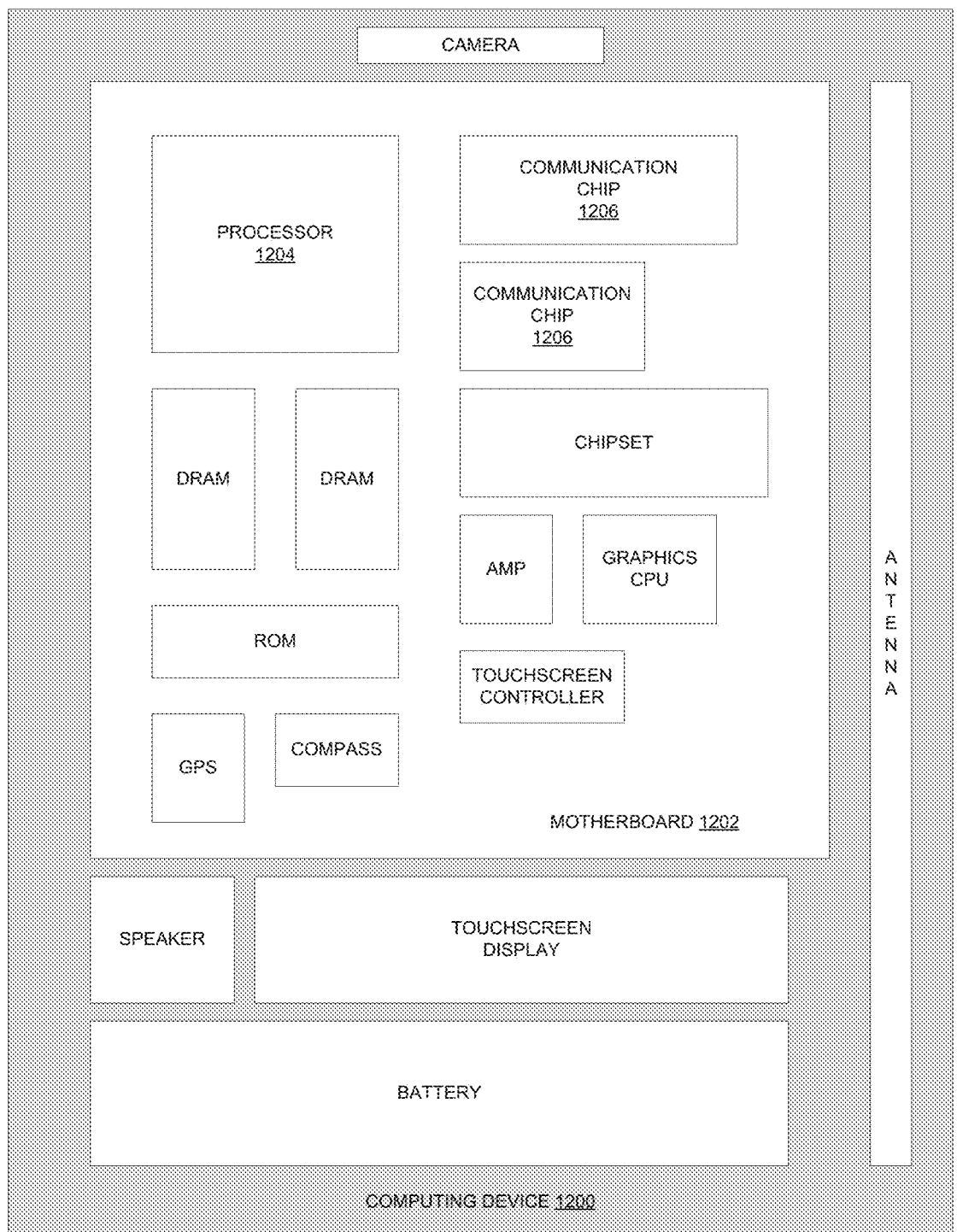
FIG. 12 schematically illustrates an example system that may include transistor devices with various threshold voltages as described herein, in accordance with some embodiments.

FIG. 12 schematically illustrates an example system (e.g., computing device 1200) that may include transistor devices with various threshold voltages as described herein, in accordance with some embodiments. The motherboard 1202 may include a number of components, including but not limited to a processor 1204 and at least one communication chip 1206. The processor 1204 may be physically and electrically coupled to the motherboard 1202. In some implementations, the at least one communication chip 1206 may also be physically and electrically coupled to the motherboard 1202. In further implementations, the communication chip 1206 may be part of the processor 1204.

Depending on its applications, computing device 1200 may include other components that may or may not be physically and electrically coupled to the motherboard 1202. These other components may include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, a camera, and a mass storage device (such as hard disk drive, compact disk (CD), digital versatile disk (DVD), and so forth).

The communication chip 1206 may enable wireless communications for the transfer of data to and from the computing device 1200. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1206 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible BWA networks are generally referred to as WiMAX networks, an acronym that stands for Worldwide Interoperability for Microwave Access, which is a certification mark for products that pass conformity and interoperability tests for the IEEE 802.16 standards. The communication chip 1206 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 1206 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1206 may operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication chip 1206 may operate in accordance with other wireless protocols in other embodiments.

The computing device 1200 may include a plurality of communication chips 1206. For instance, a first communication chip 1206 may be dedicated to shorter range wireless communications such as Wi-Fi and Bluetooth and a second communication chip 1206 may be dedicated to longer range wireless communications such as GPS, EDGE, GPRS, CDMA, WiMAX, LTE, Ev-DO, and others.

The processor 1204 of the computing device 1200 may include a die (e.g., die 102 of FIGS. 1-2) having transistors structures with modulated threshold voltage using workfunction modifying layers as described herein. For example, the die 102 of FIGS. 1-2 may be mounted in a package assembly that is mounted on the motherboard 1202. The term "processor" may refer to any device or portion of a device that processes electronic data from registers and/or memory to transform that electronic data into other electronic data that may be stored in registers and/or memory.

The communication chip 1206 may also include a die (e.g., die 102 of FIGS. 1-2) having transistors structures with modulated threshold voltage using workfunction modifying layers as described herein. In further implementations, another component (e.g., memory device or other integrated circuit device) housed within the computing device 1200 may contain a die (e.g., die 102 of FIGS. 1-2) having transistors structures with modulated threshold voltage using workfunction modifying layers as described herein.

In various implementations, the computing device 1200 may be a mobile computing device, laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 1200 may be any other electronic device that processes data.

EXAMPLES

According to various embodiments, the present disclosure describes an apparatus. Example 1 of the apparatus may include a semiconductor substrate, a channel body disposed on the semiconductor substrate, a first gate electrode having a first thickness coupled with the channel body and a second gate electrode having a second thickness coupled with the channel body, wherein the first thickness is greater than the second thickness. Example 2 may include the apparatus of Example 1, further including a third gate electrode having a third thickness coupled with the channel body, wherein the second thickness is greater than the third thickness and wherein the first gate electrode, the second gate electrode and the third gate electrode are composed of a first material having a same chemical composition. Example 3 may include the apparatus of Example 2, further including a fourth gate electrode having a fourth thickness coupled with the channel body, wherein the fourth thickness is greater than the first thickness and the fourth gate electrode is composed of a second material having a different chemical composition than the first material. Example 4 may include the apparatus of Example 3, wherein the second gate electrode is disposed between the first gate electrode and the third gate electrode and the third gate electrode is disposed between the second gate electrode and the fourth gate electrode. Example 5 may include the apparatus of Example 3, wherein the first material is a p-type workfunction metal and the second material is an n-type workfunction metal. Example 6 may include the apparatus of Example 1 or 2, wherein the first gate electrode and the second gate electrode are composed of a first material having a same n-type or p-type composition, the apparatus further comprising a second material disposed on the first material of the first gate electrode and the second gate electrode, wherein the second material has n-type composition if the first material has p-type composition and has p-type composition if the first material has n-type composition. Example 7 may include the apparatus of Example 1, wherein the first gate electrode and the second gate electrode are composed of a first material having a same n-type or p-type composition, the apparatus further comprising a second material disposed on the first material of the first gate electrode and a third material disposed on the first material of the second gate electrode, wherein the second material has n-type composition if the first material has p-type composition and has p-type composition if the first material has n-type composition, and wherein the second material and the third material have a different chemical composition. Example 8 may include the apparatus of Example 1, wherein the first gate electrode and the second gate electrode are composed of a first material having a same n-type or p-type composition, the apparatus further comprising a second material disposed on the first material of the first gate electrode and a third material disposed on the second material, wherein the third material is a fill material that is more p-type than the first material and more n-type than the second material. Example 9 may include the apparatus of any of Examples 1-8, further comprising a gate dielectric film disposed between the first gate electrode and the channel body and between the second gate electrode and the channel body. Example 10 may include the apparatus of any of Examples 1-8, wherein the channel body is a fin structure composed of a semiconductor material that is undoped. Example 11 may include the apparatus of any of Examples 1-8, wherein the first thickness is equal to 30 Angstroms or less.

According to various embodiments, the present disclosure describes a method. Example 12 of a method may include providing a channel body disposed on a semiconductor substrate and forming a first gate electrode and a second gate electrode coupled with the channel body, wherein the first gate electrode has a first thickness, the second gate electrode has a second thickness and the first thickness is greater than the second thickness. Example 13 of the may include the method of Example 12, wherein forming the first gate electrode and the second gate electrode comprises simultaneously depositing an electrode material in a first region of the first gate electrode and a second region of the second gate electrode as part of a first deposition selectively removing the electrode material in the second region and simultaneously depositing the electrode material in the first region and the second region as part of a second deposition subsequent to selectively removing the electrode material in the second region. Example 14 may include the method of Example 13 further comprising forming a third gate electrode coupled with the channel body, wherein the third gate electrode has a third thickness and the second thickness is greater than the third thickness. Example 15 may include the method of Example 14, wherein selectively removing the electrode material in the second region is part of a first removal and forming the third gate electrode comprises simultaneously depositing the electrode material in a third region of the third gate electrode when simultaneously depositing the electrode material in the first region and the second region as part of the first deposition, selectively removing the electrode material in the third region when selectively removing the electrode material in the second region as part of the first removal, simultaneously depositing the electrode material in the third region when simultaneously depositing the electrode material in the first region and the second region as part of the second deposition, selectively removing the electrode material in the third region as part of a second removal and simultaneously depositing the electrode material in the first region, the second region and the third region as part of a third deposition subsequent to selectively removing the electrode material in the third region as part of the second removal. Example 16 may include the method of Example 13, further comprising forming a fourth gate electrode having a fourth thickness coupled with the channel body, wherein the fourth thickness is greater than the first thickness and the fourth gate electrode is composed of another electrode material having a different chemical composition than the electrode material. Example 17 may include the method of Example 13, wherein the electrode material of the first gate electrode and the second gate electrode have a same n-type or p-type composition, the method further comprising depositing another electrode material on the electrode material of the first gate electrode and the second gate electrode, wherein the second material has n-type composition if the first material has p-type composition and has p-type composition if the first material has n-type composition. Example 18 may include the method of Example 12, wherein forming the first gate electrode comprises replacing a sacrificial material with material of the first gate electrode. Example 19 may include the method of Example 12, further comprising forming a third gate electrode on the first gate electrode and forming a fourth gate electrode on the third gate electrode, wherein material of the fourth gate electrode is a fill material that is more p-type than material of the first gate electrode and more n-type than material of the third gate electrode. Example 20 may include the method of any of Examples 12-19, further comprising forming a gate dielectric film on the channel body prior to forming the first gate electrode and the second gate electrode. Example 21 may include the method of any of Examples 12-19, wherein no doping process is performed on the channel body to modulate a threshold voltage of one or more transistors.

According to various embodiments, the present disclosure describes a system (e.g., a computing device). Example 22 of a computing device includes a circuit board and a die coupled with the circuit board, the die including a semiconductor substrate, a channel body disposed on the semiconductor substrate, a first gate electrode having a first thickness coupled with the fin structure, and a second gate electrode having a second thickness coupled with the channel body, wherein the first thickness is greater than the second thickness. Example 23 may include the computing device of Example 22, further comprising a third gate electrode having a third thickness coupled with the channel body, wherein the second thickness is greater than the second thickness and the first gate electrode, the second gate electrode and the third gate electrode are composed of a first material having a same chemical composition. Example 24 may include the computing device of Example 22 or 23, wherein the die is a processor and the computing device is a mobile computing device including one or more of an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, and a camera.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated implementations, including what is described in the Abstract, is not intended to be exhaustive or to limit the embodiments of the present disclosure to the precise forms disclosed. While specific implementations and examples are described herein for illustrative purposes, various equivalent modifications are possible within the scope of the present disclosure, as those skilled in the relevant art will recognize.

These modifications may be made to embodiments of the present disclosure in light of the above detailed description. The terms used in the following claims should not be construed to limit various embodiments of the present disclosure to the specific implementations disclosed in the specification and the claims. Rather, the scope is to be determined entirely by the following claims, which are to be construed in accordance with established doctrines of claim interpretation.

What is claimed is:

1. An apparatus comprising:
    a first fin and a second fin, wherein the first and second fins include silicon;
    a first gate electrode, of a first n-type metal-oxide-semiconductor (NMOS) transistor, on a top surface and sidewalls of the first fin, the first gate electrode including a first layer having a first thickness above the top surface of the first fin, the first layer of the first gate electrode having a composition;
    a second gate electrode, of a second NMOS transistor, on a top surface and sidewalls of the second fin, wherein the second gate electrode includes a second layer having a second thickness above the top surface of the second fin that is different than the first thickness, the second layer of the second gate electrode having the composition, wherein the first layer and the second layer include tantalum, titanium, and aluminum, and wherein the first gate electrode and the second gate electrode comprise a fill material above the first layer and the second layer, respectively; and
    a first gate dielectric between the first gate electrode and the first fin and a second gate dielectric between the second gate electrode and the second fin, the first and second gate dielectrics including hafnium and oxygen.

2. The apparatus of claim 1, wherein the first and second gate electrodes include a plurality of layers including the respective first and second layers, wherein the plurality of layers of the first and second gate electrodes are formed of the same materials, and wherein the first and second layers have a same order within the respective plurality of layers.

3. The apparatus of claim 1, further comprising:
    a third fin; and
    a third gate electrode on a top surface and sidewalls of the third fin, wherein the third gate electrode includes a third layer having a third thickness above the top surface of the third fin that is different than the first and second thicknesses, wherein the third layer includes tantalum.

4. The apparatus of claim 1, wherein the first and second layers include a first metal, and wherein the first and second gate electrodes further comprise a second metal on the respective first and second layers.

5. The apparatus of claim 4, wherein:
    the first metal is a p-type workfunction metal and the second metal is an n-type workfunction metal, or
    the first metal is an n-type workfunction metal and the second metal is a p-type workfunction metal.

6. The apparatus of claim 1, wherein the first and second layers include a first metal,
    wherein the first gate electrode includes a second metal on and in contact with the first layer, and wherein the second gate electrode includes a third metal on and in contact with the second layer, wherein the first, second, and third metals have different chemical compositions.

7. The apparatus of claim 1, wherein the first and second layers include a first metal, and wherein the first and second gate electrodes further comprise:
    a second metal on and in contact with the first layer; and
    a third metal on and in contact with the second metal, wherein a workfunction of the third metal is more p-type than the first metal and more n-type than the second metal.

8. The apparatus of claim 1, wherein the first and second fins are undoped.

9. The apparatus of claim 1, wherein the first thickness is 5 Angstroms or less and the second thickness is greater than 5 Angstroms.

10. The apparatus of claim 1, wherein a first workfunction of the first electrode and a second workfunction of the second electrode are based on the respective first thickness and second thickness.

11. A computing device comprising:
    a circuit board; and
    a die coupled with the circuit board, the die including
        a first fin and a second fin, wherein the first and second fins include silicon;
        a first gate electrode, of a first n-type metal-oxide-semiconductor (NMOS) transistor, on a top surface and sidewalls of the first fin, the first gate electrode having a first stack of metal layers including a first metal layer with a first thickness; and
        a second gate electrode, of a second NMOS transistor, on a top surface and sidewalls of the second fin, the second gate electrode having a second stack of metal layers including a second metal layer with a second thickness that is different than the first thickness, wherein the first and second stacks of metal layers have a same material composition, wherein the first and second metal layers correspond to a same layer within the respective first and second stacks of metal layers, and wherein the first and second metal layers are composed of a same material that includes tantalum, titanium, and aluminum, and wherein the first gate electrode and the second gate electrode comprise a fill material above the first layer and the second layer, respectively.

12. The computing device of claim 11, further comprising a dielectric material disposed between the first stack of metal layers and the first fin and disposed between the second stack of metal layers and the second fin, wherein the first and second gate electrodes are in direct contact with the dielectric material, and wherein the dielectric material includes hafnium and oxygen.

13. The computing device of claim 11, further comprising:
a third gate electrode on a top surface and sidewalls of a third fin, the third gate electrode having a third stack of layers including a third metal layer with a third thickness that is different than the first and second thicknesses, wherein the first, second, and third metal layers are composed of the same metal.

14. The computing device of claim 11, further comprising:
a third gate electrode on a top surface and sidewalls of a third fin, the third gate electrode including a third metal layer with a third thickness that is different than the first thickness, wherein the third metal layer is composed of a different metal than the first and second metal layers.

15. The computing device of claim 11, wherein:
the die is a processor; and
the computing device is a mobile computing device including one or more of an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, and a camera.

* * * * *